United States Patent [19]

Sakurai et al.

[11] Patent Number: 4,604,343

[45] Date of Patent: Aug. 5, 1986

[54] WATER DEVELOPABLE PHOTOSENSITIVE RESINOUS COMPOSITION

[75] Inventors: Kiyomi Sakurai, Neyagawa; Katsuzi Konishi, Izumisano, both of Japan

[73] Assignee: Nippon Paint Co., Ltd., Osaka, Japan

[21] Appl. No.: 744,293

[22] Filed: Jun. 13, 1985

Related U.S. Application Data

[63] Continuation of Ser. No. 582,791, Feb. 23, 1984, abandoned.

[51] Int. Cl.[4] ................................................ G03C 1/68
[52] U.S. Cl. .................................... 430/281; 430/283; 430/288; 522/113
[58] Field of Search ................... 204/159.15; 430/281, 430/283, 288; 522/113

[56] References Cited

U.S. PATENT DOCUMENTS

| | | | |
|---|---|---|---|
| 3,801,638 | 4/1974 | Cerwonka | 430/288 |
| 3,809,633 | 5/1974 | Magnotta et al. | 430/288 |
| 3,833,384 | 9/1974 | Noonan et al. | 430/288 |
| 4,209,581 | 6/1980 | Takanashi et al. | 430/288 |

Primary Examiner—Jack P. Brammer
Attorney, Agent, or Firm—Wenderoth, Lind & Ponack

[57] ABSTRACT

A water developable photosensitive resin composition comprising a water soluble polymer, photopolymerizable unsaturated monomer(s) and a photopolymerization initiator, which is characterized in that as the whole or a part of said photopolymerizable unsaturated monomer(s), there is employed a product made by mixing of 1 mole of urea, thiourea or an alkyl derivative thereof and 0.75 to 1.3 moles of an N-alkylol acryl amide or an N-alkylol methacrylamide. The composition is useful for an image formation through a photopolymerization reaction and developable by water treatment to give a soft and rubber like resilient cured product.

6 Claims, No Drawings

WATER DEVELOPABLE PHOTOSENSITIVE RESINOUS COMPOSITION

This application is a continuation of now abandoned application Ser. No. 582,791, filed Feb. 23, 1984, now abandoned.

FIELD OF INVENTION

The present invention relates to a photosensitive resinous composition suitable for use in an image formation by making use of a so-called photopolymerization reaction. More particularly, the invention relates to a composition which is developable by water alone in the image formation and is capable of giving a soft and rubber like resilience cured product.

BACKGROUND OF THE INVENTION

Photosensitive resins that utilize photopolymerization of polymerizable unsaturated monomers have been used in various application areas including photopolymer printing plates, ultraviolet ray curable inks, photocurable paints, photoresists and the like.

However, in the heretofore known photosensitive resins, the photopolymerizable unsaturated monomers generally used are acrylic or methacrylic esters. These monomers tend to give, when photopolymerized, vitreous polymers at normal temperatures and therefore the resinous compositions thus produced are hard, brittle cured products. These brittle resinous products tend to crack or peel off of the said layer from the supporting substrate when the photopolymer printing plate is subjected to a bending operation. This is especially true in the case of photosensitive resin compositions whose image formation is carried out by development with water, because a water soluble polymer is customarily used as polymeric binder in such composition and the compound itself is of a hard nature.

In addition, water-developable photopolymer printing plates which are useful in the field of flexographic printing that requires flexible and rubber like resilient plates, are unknown.

As examples of the abovesaid type of photosensitive resin composition, there have been employed the combination of a water soluble polymer (e.g. polyvinyl alcohol, a polyacrylamide, a partially saponified polyvinyl acetate, a methyl cellulose, a hydroxy propyl methyl cellulose and the like), a water soluble (meth)acrylic ester (e.g. 2-hydroxyethyl methacrylate, a 2-hydroxypropyl methacrylate, a polyethyleneglycol dimethacrylate and the like, and a photopolymerization initiator (see Japanese Patent Publication No. 27561/77). In this type of composition, there are such fatal drawbacks that the photopolymerized product of 2-hydroxyethyl methacrylate, 2-hydroxypropyl methacrylate or the like is of a vitreous nature at normal temperature, and when the water soluble polymer selected is, for example, polyvinyl alcohol, cracks occur in the formed plate, especially at the drying season in winter and such plate cannot be used in the field of flexo printing because it lacks resilience and flexibility.

Furthermore, in the abovesaid (meth)acrylic monomer system, there are additional problems such that since the photopolymerization speed is low and polymerization inhibiting effect of oxygen is high, it is difficult to produce a good quality image, unless all of the oxygen contained in the layer are replaced by carbon dioxide gas or consumed by means of bump-exposure without a negative film before image forming exposure.

For the purpose of overcoming the aforesaid drawbacks possessed by the (meth)acrylic monomer system there has been proposed a combination of a condensation oligomer of alkylol or alkylated alkylol derivative of urea or thiourea with N-alkylol(meth)acrylamide, and a water soluble polymer (e.g. polyvinyl alcohol), (see U.S. Pat. No. 4,209,581).

This condensation oligomer is satisfactorily compatible with a water soluble polymer, has an improved photopolymerization speed and can supplement the aforesaid drawbacks possessed by a (meth)acrylic monomer system. However, the photocured product is very hard, and there still remains the question of fragility of the formed plate which makes it unsuitable in the flexo printing field.

Moreover, in a condensation polymerization reaction, formaldehyde is always by-produced and therefore, unless the formed formaldehyde is completely removed out of the reaction product by purification, the condensation product cannot be used in admixture with a water soluble polymer as polyvinyl alcohol, since polyvinyl alcohol reacts with formaldehyde.

The inventors, having made attempts to discover a material which is compatible with a water soluble polymer, and which can relieve the drawbacks possessed by heretofore used photopolymerizable unsaturated monomers, such drawbacks being the fragility of the formed plate due to the hardness and lower photocuring speed and which improved product can give sufficient flexibility and rubber like resilience so as to be used in the flexo printing field. The inventors have discovered a product which can overcome these difficulties by mixing a particular weight ratio of urea, thiourea or an alkyl derivative thereof and an N-alkylol acrylamide or an N-alkylol methacrylamide and on the basis of this finding have completed the invention.

SUMMARY OF THE INVENTION

The gist of the invention resides in the following: The invention consists of a water developable, photosensitive resin composition comprising as basic components, a water soluble polymer, photopolymerizable unsaturated monomer(s) and a photopolymerization initiator, the improvement characterized in that there is used as a part or whole of said photopolymerizable unsaturated monomer(s), a product made by mixing of 1 mole of urea, thiourea or alkyl derivative thereof, and 0.75 to 1.3 moles of N-alkylol acrylamide or N-alkylol methacrylamide.

The mixing product which is useful as photopolymerizable unsaturated monomer in the present invention can afford, as is clear from the later stated reference examples, when mixed with a photopolymerization initiator, a formed coating which when irradiated by light produces a soft photocured product having a low rubbery hardness in a short period of time.

Heretofore there has been proposed, highly water soluble, photopolymerizable unsaturated monomers such as 2-hydroxyethylmethacrylate which are easily affected by oxygen in the photopolymerization step. Therefore, when the coating is uncovered and irradiated by light while allowing the exposed surface to be contacted with air, curing occurs only in the inner portion and not in the air-contacted surface area. The said mixing product of the invention, however, is characterized in that since the photocuring speed is very high, it is hardly affected by oxygen and therefore, photocuring effectively occurs even at the surface area contacted with air.

Such a mixing product may be advantageously prepared by reacting 1 mole of urea, thiourea or an alkyl derivative thereof (hereinafter called as urea series compound) and 0.75 to 1.3 moles of N-alkylol(meth)acrylamide, in a water or a hydrophilic organic solvent and if desired, in the presence of an acid or an alkaline catalyst and thermal polymerization inhibitor, at 60° to 95° C. for 1 to 5 hours, under stirring.

As the urea series compound, mention is made of a compound of the following formula:

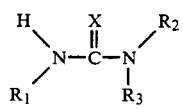

wherein $R_1, R_2$ and $R_3$ are the same or different, and each represents hydrogen or a lower alkyl group (e.g. methyl, ethyl, propyl, butyl and the like), and X represents oxygen or a sulfur atom.

Examples of said compounds are urea, thiourea, 1,3-dimethyl urea, 1,1-dimethylurea, 1,3-diethylthiourea and the like. As the N-alkylol(meth)acrylamide, mention is made of N-alkylol acrylamide or N-alkylol methacrylamide, whose alkylol is a lower alkylol such as methylol, ethylol, propylol, butylol, isobutylol and the like. As the hydrophilic organic solvent except for water, methanol or ethanol is preferably used. As the catalyst, there is preferably used an inorganic acid such as hydrochloric acid, sulfuric acid, phosphoric acid and the like or ammonium salts thereof, organic carboxylic acids such as formic acid, oxalic acid and tartaric acid, p-toluene sulfonic acid and its ammonium salt, and an alkali such as sodium hydroxide, potassium hydroxide, ammonium hydroxide and the like.

As the heat polymerization inhibitor, use is made of such members as hydroquinone and methyl hydroquinone customarily used in the synthesis of high molecular weight compound. When a urea series compound and an N-alkylol(meth)acrylamide are mixed in the weight ratio outside the above-mentioned range, various troubles are encountered as shown below:

That is, as is clear from the later stated reference examples, if the N-alkylol(meth)acrylate is used in an excess amount and the mixing is carried out in water, crystals would be precipitated out of the mixing product and when subjected to photocuring, a vitreous hard cured product having no rubbery elasticity would be obtained. Furthermore, since the abovesaid crystalline compound has a lower solubility, it has only limited compatibility with water soluble polymers and hence is easily regenerated out as crystals from the photosensitive resin layer. Whereas, in a lesser quantity, when the mixing is carried out in water, there are such problems that the reaction system will be coagulated with the lapse of time, thereby resulting in handling difficulties and the photocured product is of extremely poor quality in water resistance and the like.

In the present invention, the abovesaid mixing product may be used directly, without the necessity of isolating the product, for the preparation of the photosensitive resin composition of this invention. This is because, the mixing product is very stable and its pH value is almost neutral. Therefore, without using any further purification, it may satisfactorily be combined with the water soluble polymer and the resin layer formed from thus obtained resin composition is likewise stable and there occurs no precipitation of crystals of said mixing product and no regeneration of crystals at the surface of said layer.

The starting material, N-alkylolacrylamide is usually present in white crystal form, and when the material is used alone in the making of the photosensitive resin layer, it may be easily precipitated out and separated from the resin layer as white crystals with the lapse of time.

In the present invention, the abovesaid mixing product may be used as the whole of the photopolymerizable unsaturated monomer, or if desired may be replaced in part by other monomers in obtaining the photosensitive resin plate with improved image quality and water resistance.

At this time, the amount of said other monomers is preferably 70% by weight or less and most preferably 50% by weight or less. If the quantity of such monomer is too excessive, there is a trend that plate cracks and inferior adhesion of resinous layer would be occured because of undesirable increase in hardness of the photosensitive resinous plate. As the other monomers, any of the known members customarily used in the related field may be satisfactorily used, including ethyleneglycol di(meth)acrylate, polyethylene glycol di(meth)acrylate (2 to 14 ethyleneglycol units), trimethylpropane tri(meth)acrylate, pentaerythritol di(meth)acrylate, pentaerythritol tri(meth)acrylate, pentaerythritol tetra(meth)acrylate, glycerol di(meth)acrylate, N,N'-methylene bis(meth)acrylate, neopentylglycol di(meth)acrylate, (meth)acrylic oligomers derived from epoxy resin and urea resin.

As the water soluble polymer used in the present invention, mention is made of such members as polyvinyl alcohol, partially saponified polyvinyl acetate, methyl cellulose, ethyl cellulose, hydroxypropyl propyl cellulose, hydroxy propylmethyl cellulose, polyethylene oxide, polyacrylamide, maleic acid copolymer and a nylon resin having water soluble groups and the like.

As the photopolymerization initiator, any of the compounds capable of generating radicals directly or indirectly therefrom through photo-irradiation may be used, including azo compounds, azide compounds, anthraquinone derivatives, alkylacrylketones and the like. Preferable members are alkylarylketones as, for example, alkylethers of benzoin (the alkyl being methyl, ethyl, propyl, isopropyl, butyl, isobutyl, octyl and the like), thio derivatives thereof, benzoinoxime derivatives, alkylketals (e.g. $\alpha,\alpha$-diethoxy acetophenone, $\alpha,\alpha$-dimethoxy-$\alpha$-phenyl acetophenone and the like) and acylphosphine oxides (2,4,6-trimethylbenzoyl diphenylphosphine oxide and the like).

In the present invention, to 100 parts by weight of said water soluble polymer, can be combined 10 to 250 parts by weight of photopolymerizable unsaturated monomers and 0.01 to 30 parts by weight a of photopolymerization initiator, and as optional component, 0.0001 to 5 parts by weight of other additives as heat polymerization inhibitor and antioxidant customarily used in the art concerned.

The amount of photopolymerizable unsaturated monomer is expressed, in either case of using the aforesaid reaction product alone or the combination of said reaction product and an other monomer, in terms of solid content. The present photosensitive resin composition may be obtained according to normal procedures, by combining and mixing the abovesaid components. In forming a photopolymer printing plate, any of the conventional means may be used. That is, an aqueous solution of said photosensitive resin composition may be coated on an appropriate supporting substrate or molded, and then subjected to drying to obtain the resin plate.

When the plate is exposed to light through a mask bearing a negative image, only the exposed area can be hardened very quickly. The exposed plate is then developed by spraying water or hot water, thereby obtaining relief image. This plate is finally dried to obtain a relief plate.

EXAMPLES 2 TO 13

Following the recipe given in Table 1 and the procedure of Example 1, polymerizable monomer solutions were prepared. The solutions were then treated in the same way as in Example 1. The test results are given in Table 1. Among them, Examples 11 to 13 are for the comparison's sake. The cured products of Examples 11 and 12 showed a Shore D hardness of 80° and 85°, respectively. In these examples, there occured regeneration of crystals in the systems at the time of preparation of the polymerizable monomers. In Example 13, the mixing solution was thoroughly coagulated after 1 day from the completion of the preparation.

TABLE 1

| Exam. | Urea series compound | N—methylol acrylamide | catalyst | p-methyl hydroquinone | solvent | hardness of cured product (Shore A) |
| --- | --- | --- | --- | --- | --- | --- |
| 2 | urea 60 g (1 mole) | 88 g (0.875 mole) | ammonium chloride 1.4 g | 0.7 g | water 20 g | 45 |
| 3 | urea 60 g (1 mole) | 101 g (1 mole) | ammonium chloride 0.8 g | 0.7 g | water 20 g | 55 |
| 4 | urea 60 g (1 mole) | 113 g (1.125 mole) | ammonium chloride 1.4 g | 0.7 g | water 20 g | 78 |
| 5 | urea 60 g (1 mole) | 126 g (1.25 mole) | ammonium chloride 1.4 g | 0.7 g | water 20 g | 92 |
| 6 | urea 60 g (1 mole) | 101 g (1 mole) | ammonium chloride 1.4 g | 0.7 g | water 20 g | 35 |
| 7 | urea 60 g (1 mole) | 101 g (1 mole) | sodium hydroxide 0.1 g | 0.7 g | water 20 g | 70 |
| 8 | thiourea 76 g (1 mole) | 101 g (1 mole) | ammonium chloride 1.4 g | 0.7 g | water 20 g | 82 |
| 9 | 1,3-dimethylurea 88 g (1 mole) | 101 g (1 mole) | ammonium chloride 1.4 g | 0.7 g | water 20 g | 68 |
| 10 | urea 60 g (1 mole) | 101 g (1 mole) | ammonium chloride 1.4 g | 0.7 g | ethanol 20 g | 75 |
| 11 | urea 60 g (1 mole) | 138 g (1.366 mole) | ammonium chloride 1.4 g | 0.7 g | water 20 g | 98 |
| 12 | urea 60 g (1 mole) | 202 g (2.0 mole) | ammonium chloride 1.4 g | 0.7 g | water 20 g | 100< |
| 13 | urea 60 g (1 mole) | 50 g (0.5 mole) | ammonium chloride 1.4 g | 0.7 g | water 20 g | 38 |

The abovesaid mixing products of the present photopolymerizable unsaturated monomers possess the characteristics of increased photopolymerization speed and improved water solubility, and therefore, the present photopolymer printing plates are developable in a shorter period of time as compared with those of any of the known plates. The thus obtained relief plates have appropriate rubber elasticity and flexibility and therefore, are useful as flexo-printing plates, too. Such flexibility may be obtained by the addition of known plasticizer, but in this invention, no such additive is required at all.

The invention shall be now more fully explained in the following examples. Unless otherwise stated, all parts and % are by weight.

EXAMPLE 1

0.07 g of methyl hydroquinone and 1.4 g of ammonium chloride were dissolved in 20 g of water and the solution was placed in a four necked flask fitted with a condenser. To this, were added 60 g (1 mole) of urea and 101 g (1 mole) of N-methylol acrylamide and the mixture was, while stirring, heated to 80° C. and reacted for 2 hours. After 2 hours of the agitation, the content was allowed to cool to obtain an aqueous solution of a polymerizable monomer, the mixing product of urea and N-methylol acrylamide.

To 10 g of the thus obtained aqueous solution, was added 1 g of 10% methanol solution of benzoin isopropylether, and the mixture was poured into a round cup having about 40 cm² area, dried in a dark place for 1 day, and then exposed to 3 KW high pressure mercury lamp placed at 70 cm distance for 30 seconds to obtain a cured product hardened to the surface thereof. It showed 60° of Shore A hardness and was a soft excellent elastomeric product.

EXAMPLE 14

40 parts by weight of partially saponified polyvinyl acetate having a polymerization degree of 500 and saponification degree of 82 mole %, was added to 60 parts by weight of water and heated to dissolve therein. To the thus obtained aqueous solution, was added 35 parts by weight of polymerizable monomer solution prepared in Example 1 (solid content being 83.9% by weight), 12 parts by weight of polyethyleneglycol diacrylate (ethyleneoxide units being 9), 1.2 parts by weight of benzoin isopropylether and 0.08 part by weight of 2,6-dimethoxy-p-cresol, to obtain a uniform photosensitive resin composition. The thus obtained composition was then flowed over an iron plate having a red antihalation layer and dried for a day in a dark place to obtain a photopolymer printing plate having a resin layer of about 0.7 mm thickness. This plate was vacuum contacted with a negative film and the assembly was exposed to a 3 KW high pressure mercury lamp for 1 min. 20 sec. and then sprayed with 40° C. water (4 Kg/cm² water pressure) for 2 min. 10 sec. to wash out the unexposed portion and effect the development. Thus treated plate was dried in a dryer at 110 C. for 2 minutes. It was found that 40 microns separated fine lines were reproduced, and remaining dots at 2% high light area in 65 lines/inch half tone. This plate showed a Shore A hardness of 85° and a bending test of 180°, revealed no cracking in the plate and thus showed an improved softness and resilience.

In this example, a similar photopolymer printing plate was prepared according to the abovementioned procedures, except 30 parts by weight of 2-hydroxyethyl methacrylate were substituted for 35 parts by weight of the polymerizable monomer solution obtained in Example 1. The thus obtained plate showed wavey isolated fine lines of 70 microns line-width or less, and the reproduced fine lines were of 80 microns line-width. In a half-tone image of 65 lines/inch, there remained dots in the 5% high light portion, but no dots in the 3% or less high light area. As to the hardness, it was too hard for measurement with Shore A and hence the measurement was scaled up to a Shore D hardness.

The result was about 75°. When the plate was bended to 180°, it was fragile and peeled out from the iron plate. This plate was not enough to be used in flexo printing.

EXAMPLE 15

40 parts by weight of a partially saponified polyvinyl acetate with a polymerization degree of 500 and a saponification degree of 80 mole %, were added to 60 parts by weight of water and the mixture was heated to make a solution. To this aqueous solution, were added 100 parts by weight of a polymerizable monomer solution (the solid content being 82% by weight) obtained in Example 3, 6 parts by weight of triethyleneglycol dimethacrylate, 1.2 parts by weight of benzoin isopropylether and 0.08 part by weight of 2,6-dimethoxy-p-cresol to obtain a uniform photosensitive resinous composition.

The thus obtained composition was flowed over an iron plate having a red antihalation layer, dried for 1 day in a dark place, and then at 60° C. for 1 hour to obtain a photopolymer printing plate having a resin layer of about 0.8 mm thickness. To this plate, a negative film was vacuum contacted, and the assembly was irradiated by 3 KW high pressure mercury lamp for 1 minute, and developed by spraying onto the plate surface water at 40° C. under 4 Kg/cm$^2$ water pressure, for 1 min. and 30 seconds, thereby washing out the unexposed portion and then dried in a dryer at 110° C. for 2 minutes to obtain a relief plate, which showed 40 microns isolated fine lines and remained dots at 2% high light portion in 65 lines/inch half tone. This plate showed 80° of Shore A hardness and had an excellent rubbery elasticity and resilience.

EXAMPLE 16

40 parts by weight of a partially saponified polyvinyl acetate, the polymerization degree being 500 and the saponification degree being 80 mole%, was added to and dissolved under heating in 60 parts by weight of water. To this aqueous solution, was added 100 parts by weight of the polymerizable monomer solution (solid content being 82.6% by weight) obtained in Example 5, 1.2 parts by weight of benzoin isopropylether and 0.08 part by weight of 2,6-dimethoxy-p-cresol to obtain a uniform photosensitive resinous composition. The procedures of Example 14 were repeated with this composition, thereby obtained a photopolymer printing plate having 81° of Shore A hardness and a rubbery elasticity.

EXAMPLE 17

The procedures of Example 16 were repeated except 47 parts by weight of the polymrerizable monomer solution (solid content being 80.8% by weight) obtained in Example 9, was used in place of 100 parts by weight of the polymerizable monomer solution prepared in Example 5. A photopolymer printing plate having 95° Shore A hardness was obtained.

EXAMPLE 18

The procedures of Example 15 were repeated except 25 parts by weight of the polymerizable monomer solution (solid current being 81.6% by weight) obtained in Example 4 and 5 parts by weight of triethyleneglycol dimethacrylate was used in place of 100 parts by weight of the polymerizable monomer solution prepared in Example 3, to obtain a photopolymer printing plate having a Shore A hardness of 95°.

EXAMPLE 19

40 parts by weight of a partially saponified polyvinyl acetate having a polymerization degree of 500 and a saponification degree of 80 mole %, was added to and dissolved in 60 parts by weight of water under heating. To this aqueous solution, was added 50 parts by weight of the polymerizable monomer solution prepared in Example 1, 1.2 parts by weight of benzoin isopropyl ether and 0.08 part by weight of 2,6-dimethoxy-p-cresol to obtain a uniform photosensitive resinous composition. This composition was flowed over an iron plate having an antihalation layer and the treated plate was dried to obtain a product having a resinous layer of 0.7 mm thickness. The plate was then processed as in Example 15 and a relief plate having 85° Shore A hardness was obtained. Even after being stored in a shading bag for 3 months, there was no abnormality in the appearance of the plate.

For comparison's sake, to 40 parts by weight of the same partially saponified polyvinyl acetate, 27 parts by weight of N-methylol acrylamide, 1.2 parts by weight of benzoin isopropyl ether and 0.08 part by weight of 2,6-dimethoxy-p-cresol were added and dissolved to obtain a uniform photosensitive resinous composition.

This was treated in the same way as stated hereinabove to obtain a photopolymer printing plate and then processed to obtain a relief plate. The Shore D hardness of this plate was 60° and the remaining image was made up of dots at 5% high light portion in a 65 lines/inch half tone. This plate was then stored in a shading bag and however, white crystals were regenerated out whole over the plate after only a 2 weeks storing test.

What is claimed is:

1. In a water developable photosensitive composition consisting essentially of a water soluble polymer selected from the group consisting of polyvinyl alcohol, partially saponified polyvinyl acetate, methyl cellulose, ethyl cellulose, hydroxypropyl propyl cellulose, hydroxy propylmethyl cellulose, polyethylene oxide, polyacrylamide, maleic acid copolymer and a nylon resin having water soluble groups, photopolymerizable unsaturated monomer(s), and a photopolymerization initiator, the improvement wherein at least 30% of said photopolymerizable unsaturated monomer(s) is a product made by reacting 1 mole of urea, thiourea or an alkyl derivative thereof of the formula:

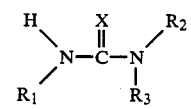

wherein $R_1$, $R_2$ and $R_3$ are the same or different, and each represents hydrogen or a lower alkyl group and X represent oxygen or a sulfur atom, and 0.75 to 1.3 moles of an N-alkylol acrylamide or an N-alkylol methacrylamide, said photosensitive resin composition being present such that for 100 parts by weight of the water soluble polymer compound, 10 to 250 parts by weight of the photopolymerizable unsaturated monomer(s) and 0.01 to 30 parts by weight of the photopolymerization initiator are present in the composition.

2. The resin composition according to claim 1, wherein the water soluble polymer is a polyvinyl alcohol or a partially saponified polyvinyl acetate.

3. The resin composition of claim 1 in which all of the photopolymerizable unsaturated monomer(s) is composed of said improvement product.

4. The resin composition of claim 1 in which the reaction of the improvement product is carried out at 60°–95° C. in the presence of a catalyst for a time sufficient to produce a resinous improvement product.

5. The resin composition of claim 1 in which at least one of the lower alkyl groups for $R_1$, $R_2$ and $R_3$ is selected from the group consisting of methyl, ethyl, propyl and butyl.

6. The resin composition of claim 1 in which the alkylol group of the N-alkylol acrylamide or methacrylamide is selected from the groups consisting of methylol, ethylol, propylol, butylol and isobutylol.

* * * * *